(12) United States Patent
Hiroki et al.

(10) Patent No.: US 9,947,564 B2
(45) Date of Patent: Apr. 17, 2018

(54) CONVEYANCE BASE AND CONVEYANCE SYSTEM

(71) Applicant: TOKYO ELECTRON LIMITED, Tokyo (JP)

(72) Inventors: Tsutomu Hiroki, Nirasaki (JP); Takehiro Nakayama, Kikugawa (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 196 days.

(21) Appl. No.: 14/650,316

(22) PCT Filed: Dec. 12, 2013

(86) PCT No.: PCT/JP2013/083999
§ 371 (c)(1),
(2) Date: Jun. 8, 2015

(87) PCT Pub. No.: WO2014/092204
PCT Pub. Date: Jun. 19, 2014

(65) Prior Publication Data
US 2015/0318197 A1    Nov. 5, 2015

(30) Foreign Application Priority Data

Dec. 12, 2012 (JP) ................... 2012-272534

(51) Int. Cl.
*B25J 11/00* (2006.01)
*H01L 21/677* (2006.01)
*H01L 21/67* (2006.01)

(52) U.S. Cl.
CPC ..... *H01L 21/67706* (2013.01); *B25J 11/0095* (2013.01); *H01L 21/67196* (2013.01); *H01L 21/67742* (2013.01)

(58) Field of Classification Search
CPC .............. B25J 11/0095; B25J 13/006; G05B 2219/33192; G05D 1/0011; G05D 1/0022;
(Continued)

(56) References Cited

U.S. PATENT DOCUMENTS 6,707,545 B1 * 3/2004 Hunter ............... G01N 21/94
250/559.45
7,458,763 B2 * 12/2008 van der Meulen .......... H01L 21/67161
414/217
(Continued)

FOREIGN PATENT DOCUMENTS

JP  2013-243312 A  12/2013
WO  WO 2010035385 A1 *  4/2010  ....... H01L 21/67167

OTHER PUBLICATIONS

International Search Report issued in PCT/JP2013/083999 dated Feb. 4, 2014 (Feb. 4, 2014).

*Primary Examiner* — Anna M Momper
*Assistant Examiner* — Brendan P Tighe
(74) *Attorney, Agent, or Firm* — Nath, Goldberg & Meyer; Jerald L. Meyer (57) ABSTRACT

Provided is a conveyance system that adjusts the position of a conveyed substrate, prevents damage resulting from the heat of another apparatus in a conveyance base, prevents insufficient electrical power of another apparatus in the conveyance base, and can move the conveyance base smoothly. A substrate processing system is provided with a conveyance chamber and a sliding box moving within the conveyance chamber. A plurality of processing modules are connected, and the sliding box is provided with: a conveyance arm that moves wafers; a servo motor that moves the conveyance arm; and a servo motor driver that controls the electrical power supplied to the servo motor. A servo motor
(Continued)

controller that controls the servo motor driver is disposed outside a transfer module, and the servo motor driver and servo motor controller perform optical communication.

10 Claims, 4 Drawing Sheets

(58) Field of Classification Search
CPC ......... H01L 21/67196; H01L 21/67703; H01L 21/67739; H01L 21/67742; H01L 21/67706
USPC .................................................. 414/222.13
See application file for complete search history.

(56) References Cited

U.S. PATENT DOCUMENTS

| 7,945,348 B2* | 5/2011 | Pannese ................. G05B 15/02 |
| | | 414/153 |
| 2010/0106299 A1* | 4/2010 | Nagata ..................... B25J 13/06 |
| | | 700/264 |

* cited by examiner

Host computer

FIG. 4

CONVEYANCE BASE AND CONVEYANCE SYSTEM

This is a National Phase Application filed under 35 U.S.C. 371 as a national stage of PCT/JP2013/083999 filed on Dec. 12, 2013, an application claiming the benefit to Japanese application No. 2012-272534 filed on Dec. 13, 2012; the content of each is hereby incorporated by reference in its entirety.

TECHNICAL FIELD

The present disclosure relates to a movable conveyance base including a conveyance arm for moving a substrate and a conveyance system including the corresponding conveyance base.

BACKGROUND

A substrate processing system for performing a process on a substrate, for example, a wafer for semiconductor devices (hereinafter simply called a "wafer") includes a plurality of process modules, that is, substrate processing apparatuses for performing a process on the wafer for each sheet, thus improving processing efficiency of the wafer.

The substrate processing system further includes a load lock module, that is, a carry-in/out apparatus for performing the carry-in/out of a wafer with respect to the substrate processing system, and a transfer module, that is, a conveyance system connected to the corresponding load lock module. The plurality of process modules is connected to the transfer module. The transfer module includes a slide box, that is, a conveyance base for conveying a wafer. The corresponding slide box includes a conveyance arm on which a wafer is loaded and that can extend/contract and rotate. Furthermore, the slide box moves within the transfer module and conveys the wafer between the load lock module and each of the process modules.

In general, in order to efficiently locate the plurality of process modules, the transfer module includes a chamber extended in the direction in which the slide box moves. In recent years, it has been proposed to configure the transfer module using a plurality of conveyance units having a block shape and to change the length of the transfer module regarding the direction in which the slide box of the transfer module moves by changing the number of conveyance units. Accordingly, the yield of semiconductor devices or a change of a process performed on a wafer can be flexibly handled by changing the number of process modules connected to the transfer module.

PRIOR ART DOCUMENTS

Patent Documents

Japanese Patent Application No. 2012-116851

SUMMARY

However, as semiconductor devices that are fabricated become miniaturized, the location of a wafer for a process module needs to be adjusted with high precision. Furthermore, since the movements in two directions are performed at the same time, the amount of information about the location of the wafer transmitted from each of the sensors for detecting the location of the wafer to a servo motor controller for controlling a servo motor for a conveyance arm through optical communication means is enormous.

Meanwhile, since the amount of information that may be transmitted is not much in the optical communication means, transmitted location information is limited, which makes it difficult to accurately adjust the location of the wafer.

Furthermore, in general, since the inside of the transfer module communicates with the inside of each of the process modules and has been decompressed, it is difficult to dissipate heat from the slide box within the transfer module. The servo motor controller within the corresponding slide box discharges heat when generating a control signal. Furthermore, the dissipation space within the slide box is reduced because the servo motor controller partially occupies the inside of the slide box. As a result, a temperature in the slide box may rise, and there is a danger that other devices within the slide box may be damaged by the heat.

Furthermore, the amount of power supplied to the slide box is limited because the slide box maintains a contactless state through the main body of the transfer module and a linear motor unit. There is a danger that power for the servo motor may be insufficient because the servo motor controller consumes power when generating a control signal.

Furthermore, if the servo motor controller is disposed in the slide box, there is a danger that the slide box may not be smoothly moved by the linear motor unit because the inertia weight of the corresponding slide box is increased.

One embodiment of the present disclosure provides a conveyance base and conveyance system, which are capable of preventing damage to other devices within the conveyance base attributable to heat, preventing the shortage of power for other devices within the conveyance base, and smoothly moving the conveyance base, by accurately controlling the location of a conveyed substrate.

In order to solve the above-mentioned problems, according to the present disclosure, there is provided a conveyance base, including: a conveyance arm moving a substrate; a motor driving the conveyance arm; and a motor driver controlling power supplied to the motor, wherein the conveyance base moves within a conveyance chamber, a control apparatus instructing the motor driver to drive the motor is disposed at a place other than the conveyance base, and the motor driver and the control apparatus perform wireless communication.

In the present disclosure, an inside of the conveyance chamber is decompressed.

In order to solve the above-mentioned problems, according to the present disclosure, there is provided a conveyance system, including: a conveyance chamber; and a conveyance base moving within the conveyance chamber, wherein the conveyance system is connected to at least one processing chamber, the conveyance base comprises a conveyance arm moving a substrate, a motor driving the conveyance arm, and a motor driver controlling power supplied to the motor, a control apparatus instructing the motor driver to drive the motor is disposed at a place other than the conveyance base, and the motor driver and the control apparatus perform wireless communication.

In the present disclosure, the conveyance system further includes a host computer, wherein the host computer and the control apparatus perform wired communication.

In the present disclosure, the conveyance chamber includes at least one sensor detecting a location of the substrate that moves, and the at least one sensor and the control apparatus perform wired communication.

In the present disclosure, the conveyance system further includes: a movement unit moving the conveyance base, and a driver of the movement unit disposed at a place other than the conveyance base, wherein the driver of the movement unit and the control apparatus perform wired communication.

In the present disclosure, an inside of the conveyance chamber is decompressed.

In the present disclosure, the motor driver and the control apparatus perform serial communication wirelessly.

In the present disclosure, a communication rate of the serial communication is 10 Mbps or more.

In the present disclosure, the wireless communication is wireless communication using radio, sound wave, or light.

In accordance with the present disclosure, since the control apparatus for instructing the motor driver to drive the motor is disposed at a place other than the conveyance base in the conveyance chamber, the sensors that are disposed in the conveyance chamber and detect the location of a substrate can be connected to the control apparatus in a wired manner. Accordingly, a large amount of location information from the sensors can be transmitted to the control apparatus. As a result, the control apparatus can accurately adjust the location of a conveyed substrate because it can accurately compute the operations of the substrate in the two-axial directions at the same time based on a large amount of the location information.

Furthermore, the other units of the conveyance base can be prevented from being damaged by heat because the control apparatus does not discharge heat in the conveyance base. Power for the other units of the conveyance base can be prevented from becoming insufficient because the control apparatus does not consume power in the conveyance base. The conveyance base can be smoothly moved because the inertia weight attributable to the control apparatus is not increased.

DETAILED DESCRIPTION

Embodiments of the present disclosure are described below with reference to the accompanying drawings.

Figure 1:
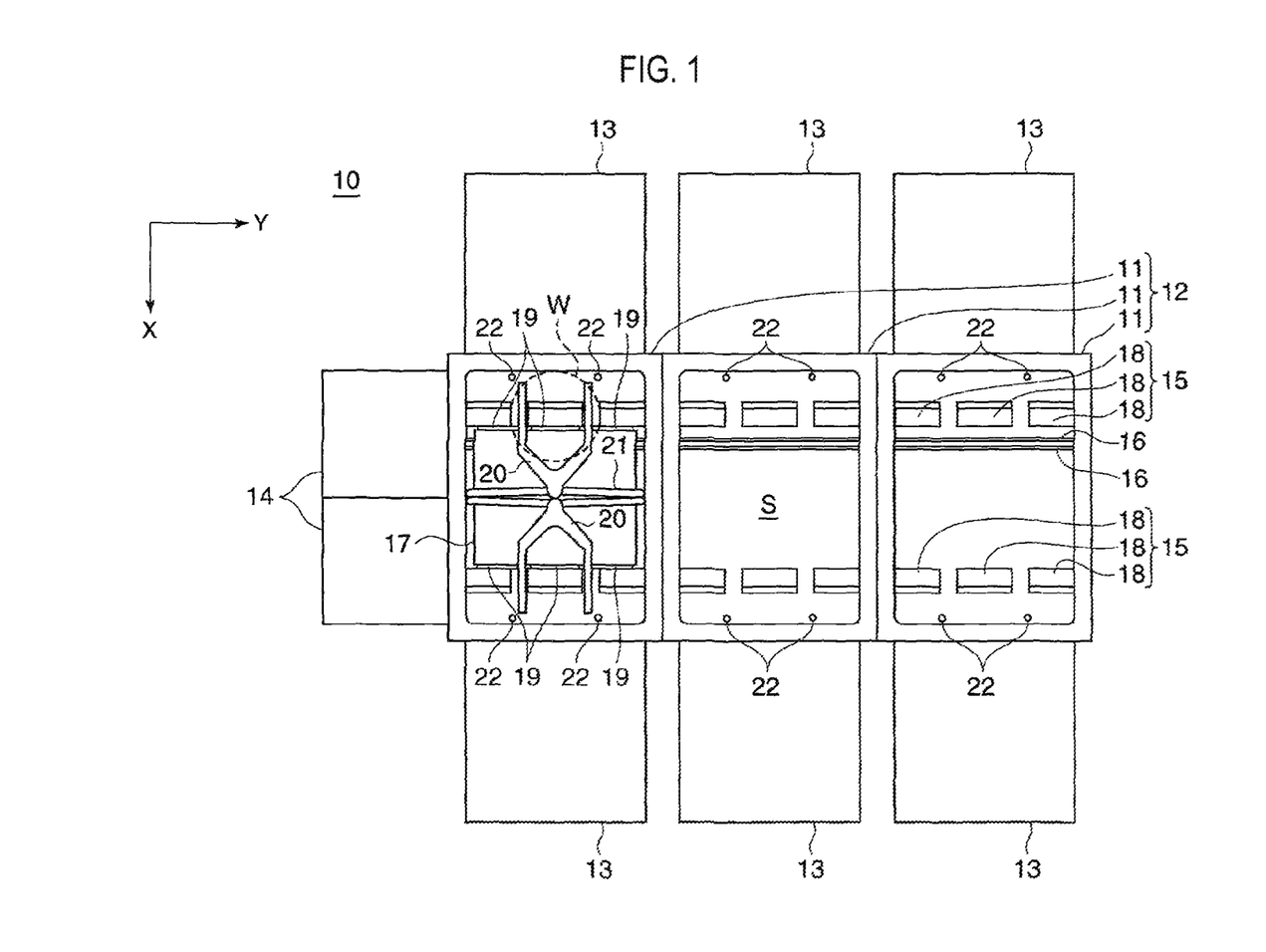
FIG. 1 is a plan view schematically illustrating the configuration of a substrate processing system including a conveyance system in accordance with an embodiment of the present disclosure.

FIG. 1 is a plan view schematically illustrating the configuration of a substrate processing system including a conveyance system in accordance with an embodiment of the present disclosure. Furthermore, FIG. 1 illustrates the state in which the cover of each of the conveyance units 11 to be described later is removed, for ease of description. Furthermore, regarding FIGS. 1 to 3, a Y direction, an X direction, and a Z direction in the figures denote the direction in which a slide box 17 to be described later moves, a direction vertical to the direction in which the slide box 17 moves on the conveyance surface of a wafer, and the height direction of a transfer module 12 to be described later, respectively.

In FIG. 1, the substrate processing system 10 includes the transfer module 12 (conveyance system) in which a plurality of the conveyance units 11 formed of housing-shaped chambers is connected in series, a plurality of process modules 13 connected to the respective conveyance units 11, and two load lock modules 14 connected to one end of the transfer module 12.

In each of the conveyance units 11, the conveyance unit 11 is inserted and disposed between two process modules 13. The inside of each of the process modules 13 is decompressed, and plasma processing, for example, dry etching processing or film forming processing is performed on a wafer W accommodated in each of the process modules 13.

In the transfer module 12, the insides of the respective conveyance units 11 that are connected communicate with each other, thus forming a conveyance chamber S. The inside of the corresponding conveyance chamber S is decompressed lower than atmospheric pressure by an exhaust apparatus or pressure valve (both not illustrated) included in the transfer module 12. More specifically, the pressure within the conveyance chamber S is set to be almost identical with the pressure within each of the process modules 13.

The transfer module 12 includes a pair of coil columns 15 disposed in the direction in which the conveyance units 11 are arranged, two feed lines 16 disposed in parallel to the corresponding coil columns 15, and the slide box 17 (conveyance base) having a parallelepiped shape disposed within the conveyance chamber S.

Each of the coil columns 15 includes a plurality of coils 18 having a rectangular shape which are disposed in two columns in parallel inside the lower part of each of the conveyance units 11. Power from the outside of the transfer module 12 is supplied to each of the coils 18. The magnetic pole of each of the coils 18 is changed by the supply of power, thereby generating an electromagnetic force. Each of the feed lines 16 has a tubular shape, and is disposed inside the lower part of the conveyance units 11. Each of the feed lines 16 is supplied with power from outside of the transfer module 12.

Figure 2:
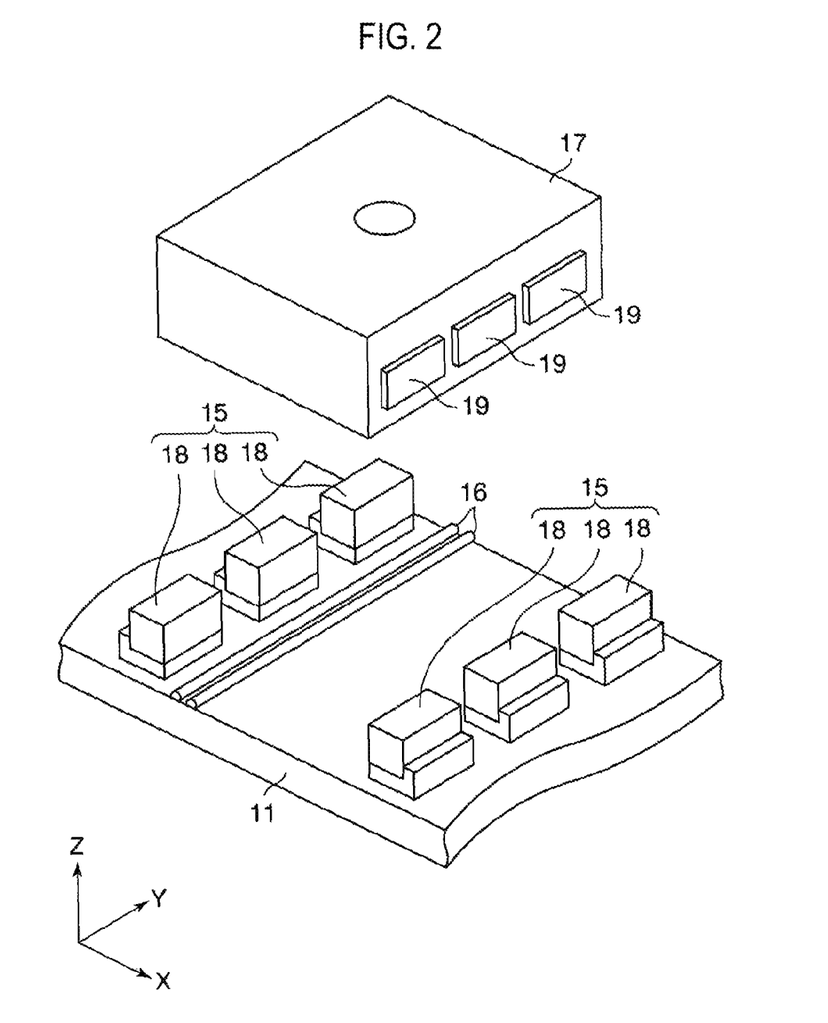
FIG. 2 is a perspective view illustrating a positional relationship between coil columns, feed lines, and a slide box within a conveyance unit in FIG. 1.

FIG. 2 is a perspective view illustrating a positional relationship between the coil columns, the feed lines, and the slide box within the conveyance units in FIG. 1. Furthermore, in FIG. 2, a conveyance arm 21 to be described later or the sidewall of the conveyance unit 11 is omitted and the slide box 17 is illustrated as being spaced apart from the bottom of the conveyance unit 11, for a simple description.

In FIG. 2, the slide box 17 is inserted and disposed between the pairs of coil columns 15. A plurality of permanent magnets 19 is disposed on both sides of the slide box 17 so that they face the respective coil columns 15. Each of the coil columns 15 and each of the permanent magnets 19 form a linear motor unit. An electromagnetic force generated by each of the coils 18 electronically drives the slide box 17 so that it moves along the coil columns 15. The slide box 17 is pulled by the coil columns 15 because it is inserted between the pairs of coil columns 15 and is thus placed at the center of the coil columns 15 on both sides thereof. Accordingly, the slide box 17 does not come in contact with any of the coil columns 15. Accordingly, the wafer W conveyed by the slide box 17 can be prevented from being contaminated by particles because the generation of particles, such as metal powder attributable to a contact, can be suppressed. Furthermore, the slide box 17 may be held in a guide (not illustrated) or may be raised and supported by magnet columns (not illustrated) disposed inside the sidewalls of the respective conveyance units 11.

Referring back to FIG. 1, the conveyance arm 21 that may be rotated and extended and contracted is included on top of the slide box 17. A servo motor 23, a servo motor driver 24, and a first optical communication device 26 to be described later are included within the slide box 17. An electricity reception transformer (not illustrated) is included on the lower part of the slide box 17. The conveyance arm 21 loads the wafer W on a fork 20 installed at the tip thereof. The feed lines 16 supply power to the slide box 17 in a contactless manner through the electricity reception transformer.

In the transfer module 12, the carry-in/out of the wafer W with respect to each of the process modules 13 are realized by combining the movement of the slide box 17 and the rotation, contraction, and extension of the conveyance arm 21. Furthermore, a pair of sensors 22 that are upward directed is disposed near a carrying-in port (not illustrated) of each of the process module 13 within the conveyance chamber S. The sensor 22 detects the location of the wafer W conveyed by the conveyance arm 21 and outputs information about the location of the wafer W.

Figure 3:
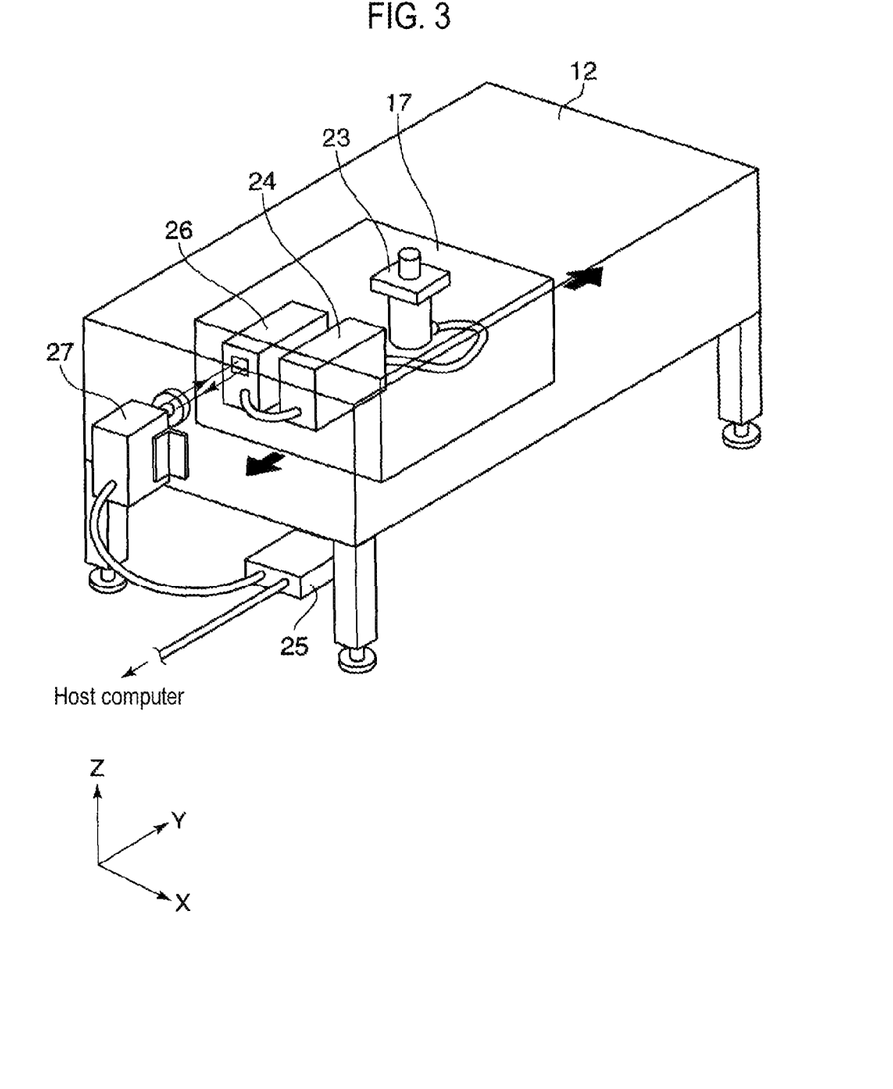
FIG. 3 is a perspective view schematically illustrating the configuration of a transfer module in FIG. 1.

FIG. 3 is a perspective view schematically illustrating the configuration of the transfer module in FIG. 1. FIG. 3 illustrates the state in which the inside of the transfer module 12 and the inside of the slide box 17 are shown and the conveyance arm 21 is omitted from the slide box 17.

In FIG. 3, the slide box 17 moving within the transfer module 12 in an arrow direction includes the servo motor 23 for driving the conveyance arm 21 with respect to a 2-axis direction, the servo motor driver 24 for controlling power supplied to the corresponding servo motor 23, and the first optical communication device 26.

Furthermore, a second optical communication device 27 that faces the first optical communication device 26 is disposed outside the slide box 17, more specifically, on the sidewall of the transfer module 12. A servo motor controller 25 (control apparatus) is disposed at a place other than the slide box 17, more specifically, outside the transfer module 12.

In the present embodiment, the servo motor driver 24 and the servo motor controller 25 exchange pieces of information using optical communication through the first optical communication device 26 and the second optical communication device 27. Furthermore, as described above, each of the feed lines 16 supplies power to the slide box 17 in a contactless manner. That is, in the transfer module 12, the slide box 17 does not come in contact with the housing-shaped main body of the transfer module 12 in a wired manner. Accordingly, there is no limit to the movement of the slide box 17 in the direction in which the slide box 17 moves (in the Y direction in FIG. 3).

Figure 4:
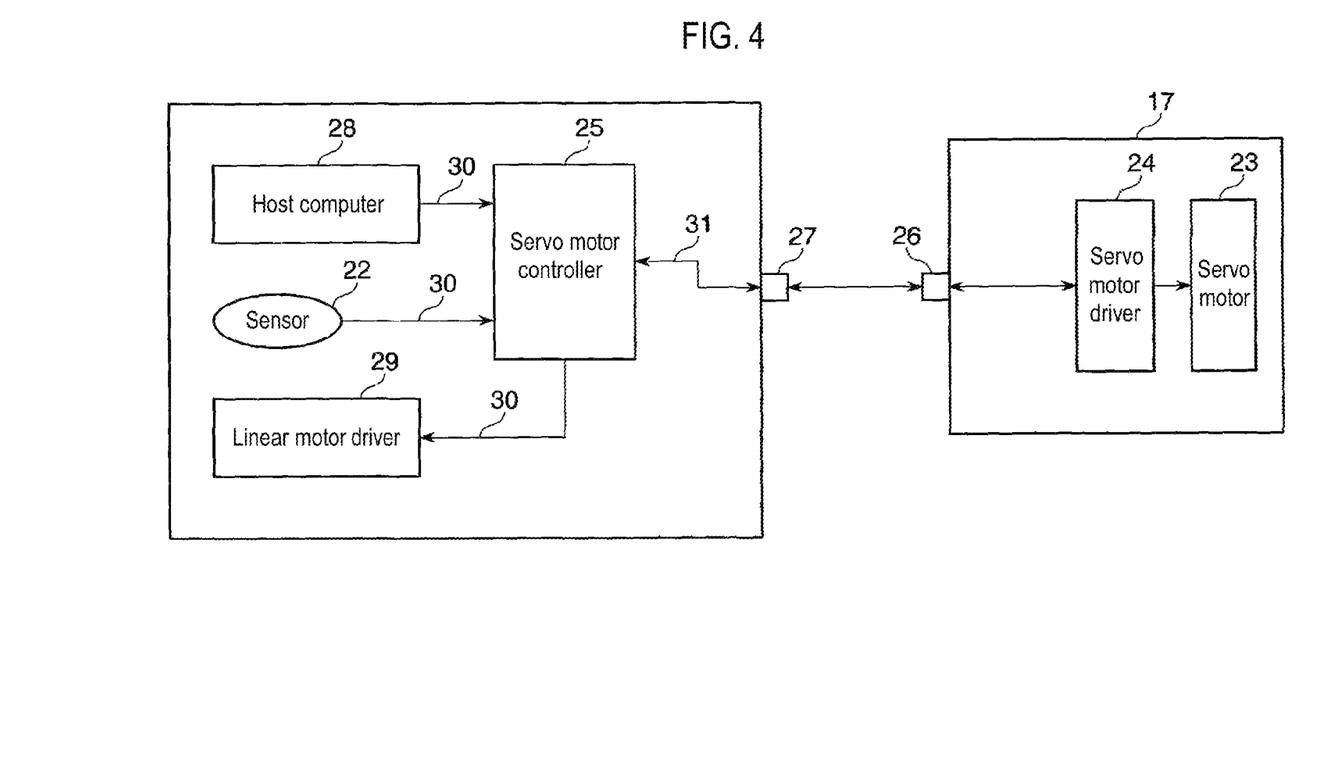
FIG. 4 is a block diagram of the substrate processing system in FIG. 1.

FIG. 4 is a block diagram of the substrate processing system in FIG. 1.

In FIG. 4, in the slide box 17, the servo motor 23 is connected to the servo motor driver 24 through a wire, and the servo motor driver 24 is connected to the first optical communication device 26 through a wire. Furthermore, outside the slide box 17, more specifically, outside the main body of the transfer module 12, a host computer 28, each of the sensors 22, and a linear motor driver 29 (the driver of the movement unit) for controlling power supplied to each of the coils 18 of the linear motor unit are connected to the servo motor controller 25 through wires 30, respectively. The servo motor controller 25 is connected to the second optical communication device 27 through the wire 31.

The servo motor controller 25 receives process information from the host computer 28 or information about the location of the wafer W from each of the sensors 22 through the wires 30, that is, wired communication means. In order to properly adjust the location of the wafer W based on the pieces of information, the servo motor controller 25 generates the control signal of the servo motor 23 for driving the conveyance arm 21 or the control signal of the linear motor unit for moving the slide box 17 and sends the control signal to the servo motor driver 24 or the linear motor driver 29. The transmission of such location information or a control signal is performed while the slide box 17 moves. Specifically, the transmission of the control signal between the servo motor controller 25 and the servo motor driver 24 is performed through optical communication means including the first optical communication device 26 and the second optical communication device 27, for example, through serial communication having a communication rate of 10 Mbps or more.

Referring back to FIG. 1, each of the load lock modules 14 performs the carry-in/out of the wafer W with respect to the transfer module 12 and the outside of the substrate processing system 10. The inside of each of the load lock modules 14 is configured to be decompressed. When the wafer W is carried in from the outside of the substrate processing system 10 to the transfer module 12, the load lock module 14 accommodates the wafer W from the container of the wafer W, for example, an FOUP, decompresses the inside thereof up to the same pressure as that of the inside of the conveyance chamber S, and transfers the wafer W to the conveyance arm 21 of the slide box 17. Furthermore, when the wafer W is carried out from the transfer module 12 outside of the substrate processing system 10, the load lock module 14 accommodates the wafer W from the conveyance arm 21, raises pressure therein up to atmospheric pressure, and transfers the wafer W to the FOUP.

In the substrate processing system 10, the transfer module 12 may be extended by installing more conveyance units 11. More specifically, the transfer module 12 is extended by connecting a new conveyance unit 11 to the end opposite the end to which the load lock module 14 of the transfer module 12 is connected and making the inside of the new conveyance unit 11 communicate with the conveyance chamber S. As in the other conveyance units 11, a plurality of rectangular coils 18 is disposed in two columns in parallel and the two feed lines 16 are disposed inside the bottom of the new conveyance unit 11. Accordingly, when the new conveyance unit 11 is connected to the transfer module 12, the plurality of coils 18 of the new conveyance unit 11 elongates the pair of coil columns 15 of the transfer module 12, and the feed lines 16 of the new conveyance unit 11 elongate the respective feed lines 16 of the transfer module 12.

Accordingly, in the substrate processing system 10, the transfer module 12 can be easily elongated, and thus more process modules 13 connected to the conveyance units 11 can be installed. Furthermore, the transfer module 12 can be easily reduced by removing the conveyance unit 11 from the transfer module 12, and thus the process modules 13 can be reduced in number. That is, in the substrate processing system 10, the processing number of wafers W can be easily increased or decreased.

In accordance with the conveyance system according to an embodiment of the present disclosure, the sensor 22 that is disposed within the conveyance chamber S and detects the location of the wafer W may be connected to the servo motor controller 25 through the wire 30 because the servo motor controller 25 for instructing the servo motor driver 24 to drive the servo motor 23 is disposed at a place other than the slide box 17, more specifically, outside the transfer module 12. Accordingly, a large amount of information about the location of the wafer W from the sensors 22 can be transmitted to the servo motor controller 25. As a result, the servo motor controller 25 can accurately adjust the location of the wafer W that is conveyed because it can accurately compute the operations of the wafer W in two axial directions (the X direction and the Y direction) at the same time based on a large amount of the location information.

Furthermore, in the aforementioned transfer module 12, since the inside of the conveyance chamber S is decompressed, heat from the slide box 17 is not discharged to the inside of the conveyance chamber S, and the slide box 17 is heated by heat discharged by embedded units. However, the slide box 17 does not overheat because the servo motor controller 25 does not discharge heat in the slide box 17. As a result, the servo motor 23 or the servo motor driver 24 disposed within the slide box 17 can be prevented from being damaged by heat.

In the aforementioned transfer module 12, power that may be consumed within the slide box 17 is limited because the power is supplied to the slide box 17 in a contactless manner. However, power for the servo motor 23 disposed within the slide box 17 can be prevented from becoming insufficient because the servo motor controller 25 does not consume power in the slide box 17.

Furthermore, in the aforementioned transfer module 12, the slide box 17 is moved by the linear motor unit. The slide box 17 can be moved smoothly and accurately because the inertia weight of the slide box 17 attributable to the servo motor controller 25 is not increased.

Furthermore, in the aforementioned transfer module 12, the host computer 28 and the servo motor controller 25 perform wired communication through the wire 30. Accordingly, the servo motor controller 25 can accurately compute the operation of the slide box 17 because it can obtain a large amount of process information from the host computer 28.

Furthermore, the linear motor driver 29 and the servo motor controller 25 perform wired communication through the wire 30. Accordingly, the servo motor controller 25 can send a large amount of control signals to the linear motor driver 29, and thus more accurately compute the operation of the slide box 17.

The present disclosure has been described above in connection with the embodiments, but the present disclosure is not limited to the described embodiments.

In the aforementioned transfer module 12, the servo motor driver 24 and the servo motor controller 25 are illustrated as exchanging pieces of information through optical communication. However, a communication type between the servo motor driver 24 and the servo motor controller 25 is not limited to such optical communication, and any communication not using a wire may be used. For example, radio communication or sound wave communication may be used. Specifically, high-speed serial communication may be used.

Furthermore, optical communication between the servo motor driver 24 and the servo motor controller 25 is not limited to serial communication, and communication having a command level capable of a larger amount of information may be used.

Furthermore, the inside of the conveyance chamber S does not need to be decompressed. For example, although the inside of the slide box 17 maintains atmospheric pressure, the present disclosure may be applied to the transfer module 12.

The place where the servo motor controller 25 is disposed is not limited to the outside of the transfer module 12, and has only to be not disposed in the slide box 17. In this case, in order to accurately compute the operations of the wafer W in the two axial directions at the same time, the servo motor controller 25 may be disposed at a place accessible to each of the sensors 22 through the wire 30. Furthermore, the place where the host computer 28 is disposed is not limited to the outside of the transfer module 12, and just must not be disposed in the slide box 17.

This application claims the benefit of Japanese Patent Application No. 2012-272534, filed on Dec. 13, 2012, in the Japan Patent Office, the disclosure of which is incorporated herein in its entirety by reference.

DESCRIPTION OF REFERENCE NUMERALS

S: conveyance chamber
W: wafer
10: substrate processing system
12: transfer module
13: process module
17: slide box
22: sensor
23: servo motor
24: servo motor driver
25: servo motor controller
26: first optical communication device
27: second optical communication device
28: host computer
29: linear motor driver
30: wire

What is claimed is:

1. A conveyance base, comprising:
a conveyance arm moving a substrate;
a motor driving the conveyance arm; and
a motor driver controlling power supplied to the motor,
wherein the conveyance base moves horizontally within a conveyance chamber,
wherein a servo motor control apparatus instructing the motor driver to drive the motor is disposed at a place other than the conveyance base, the servo motor control apparatus receiving process information from a host computer through a wire and receiving information about a location of a wafer from sensors through wires, generating a control signal for the motor to properly adjust the location of the wafer based on the information from the host computer and the sensors and sending the control signal to the motor driver, and
wherein the motor driver communicates with the servo motor control apparatus-using a wireless communication device.

2. The conveyance base of claim 1, wherein an inside of the conveyance chamber is decompressed.

3. The conveyance base of claim 1, wherein the wireless communication device includes a first optical communication device disposed in the conveyance base and a second optical communication device for optical communication with the first optical communication device, the second optical communication device being disposed outside the conveyance base and connected to the servo motor control apparatus through a wire.

4. A conveyance system, comprising:
a conveyance chamber; and a conveyance base moving horizontally within the conveyance chamber, wherein the conveyance system is connected to at least one processing chamber, wherein the conveyance base comprises a conveyance arm moving a substrate, a motor driving the conveyance arm, and a motor driver controlling power supplied to the motor, wherein a servo motor control apparatus instructing the motor driver to drive the motor is disposed at a place other than the conveyance base, the servo motor control apparatus receiving process information from a host computer through a wire and receiving information about a location of a wafer from sensors through wires, generating a control signal for the motor to properly adjust the location of the wafer based on the information from the host computer and the sensors and sending the control signal to the motor driver, and wherein the motor driver communicates with the servo motor control apparatus-using a wireless communication device.

5. The conveyance system of claim 4, further comprising:

a movement unit moving the conveyance base horizontally, and a driver of the movement unit disposed at a place other than the conveyance base, wherein the driver of the movement unit communicates with the servo motor control apparatus through a wire.

6. The conveyance system of claim 4, wherein an inside of the conveyance chamber is decompressed.

7. The conveyance system of claim 4, wherein the wireless communication device performs serial communication wirelessly.

8. The conveyance system of claim 7, wherein a communication rate of the serial communication is 10 Mbps or more.

9. The conveyance system of claim 4, wherein the wireless communication device uses radio, sound wave, or light.

10. The conveyance system of claim 4, wherein the wireless communication device includes a first optical communication device disposed in the conveyance base and a second optical communication device for optical communication with the first optical communication device, the second optical communication device being disposed outside the conveyance base and connected to the servo motor control apparatus through a wire.

* * * * *

UNITED STATES PATENT AND TRADEMARK OFFICE
CERTIFICATE OF CORRECTION

PATENT NO. : 9,947,564 B2
APPLICATION NO. : 14/650316
DATED : April 17, 2018
INVENTOR(S) : Tsutomu Hiroki and Takehiro Nakayama Page 1 of 1

It is certified that error appears in the above-identified patent and that said Letters Patent is hereby corrected as shown below:

In the Claims

Claim 1, Column 8, Line 54, please replace "apparatus-using" with "apparatus using".

Signed and Sealed this
Twenty-first Day of August, 2018

Andrei Iancu
*Director of the United States Patent and Trademark Office*